(12) United States Patent
Huang et al.

(10) Patent No.: US 8,563,334 B2
(45) Date of Patent: Oct. 22, 2013

(54) METHOD TO REMOVE SAPPHIRE SUBSTRATE

(75) Inventors: Hung-Wen Huang, Hsinchu (TW); Hsing-Kuo Hsia, Jhubei (TW); Ching-Hua Chiu, Hsinchu (TW)

(73) Assignee: TSMC Solid State Lighting Ltd., Hsinchu (TW)

(*) Notice: Subject to any disclaimer, the term of this patent is extended or adjusted under 35 U.S.C. 154(b) by 0 days.

(21) Appl. No.: 12/881,457

(22) Filed: Sep. 14, 2010

(65) Prior Publication Data

US 2012/0064642 A1 Mar. 15, 2012

(51) Int. Cl.
*H01L 21/3065* (2006.01)
*H01L 21/66* (2006.01)
*H01L 21/306* (2006.01)

(52) U.S. Cl.
USPC .................... 438/15; 438/22; 438/39

(58) Field of Classification Search
CPC ... H01L 21/3065; H01L 33/00; H01L 21/306; H01L 21/66
USPC ........ 438/15, 22, 39; 257/E21.218, E21.219, 257/E21.529
See application file for complete search history.

(56) References Cited

U.S. PATENT DOCUMENTS

| | | | | |
|---|---|---|---|---|
| 4,180,422 A | * | 12/1979 | Rosvold | 438/478 |
| 7,875,534 B2 | * | 1/2011 | Yu et al. | 438/483 |
| 2007/0170933 A1 | * | 7/2007 | Ma | 324/752 |
| 2009/0020772 A1 | * | 1/2009 | Chiu et al. | 257/98 |
| 2009/0278233 A1 | * | 11/2009 | Pinnington et al. | 257/615 |
| 2010/0003904 A1 | * | 1/2010 | Duescher | 451/259 |
| 2010/0013060 A1 | * | 1/2010 | Lamy et al. | 257/621 |
| 2010/0015787 A1 | * | 1/2010 | Yu et al. | 438/483 |
| 2010/0129991 A1 | * | 5/2010 | Shiozawa et al. | 438/478 |
| 2010/0171125 A1 | * | 7/2010 | Yoo | 257/76 |
| 2010/0314605 A1 | * | 12/2010 | Khan | 257/13 |
| 2011/0001120 A1 | * | 1/2011 | Jiang et al. | 257/13 |

OTHER PUBLICATIONS

Luxeon(R) Product Binning and Labeling, Application Brief AB21, pp. 1-8 (2007). Cf. Other Publications of US 7,838,878 by Greisen.*

* cited by examiner

*Primary Examiner* — Walter H Swanson
(74) *Attorney, Agent, or Firm* — Haynes and Boone, LLP

(57) ABSTRACT

A Light-Emitting Diode (LED) is formed on a sapphire substrate that is removed from the LED by grinding and then etching the sapphire substrate. The sapphire substrate is ground first to a first specified thickness using a single abrasive or multiple abrasives. The remaining sapphire substrate is removed by dry etching or wet etching.

20 Claims, 10 Drawing Sheets

US 8,563,334 B2

METHOD TO REMOVE SAPPHIRE SUBSTRATE

FIELD OF THE INVENTION

The present disclosure relates generally to a semiconductor light source, and more particularly, to a light-emitting diode (LED).

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction. Additionally, an optional phosphor material changes the properties of light generated by the LED.

Continued development in LEDs has resulted in efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps. However, improvements in manufacturing processes to make highly efficient and mechanically robust LEDs continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
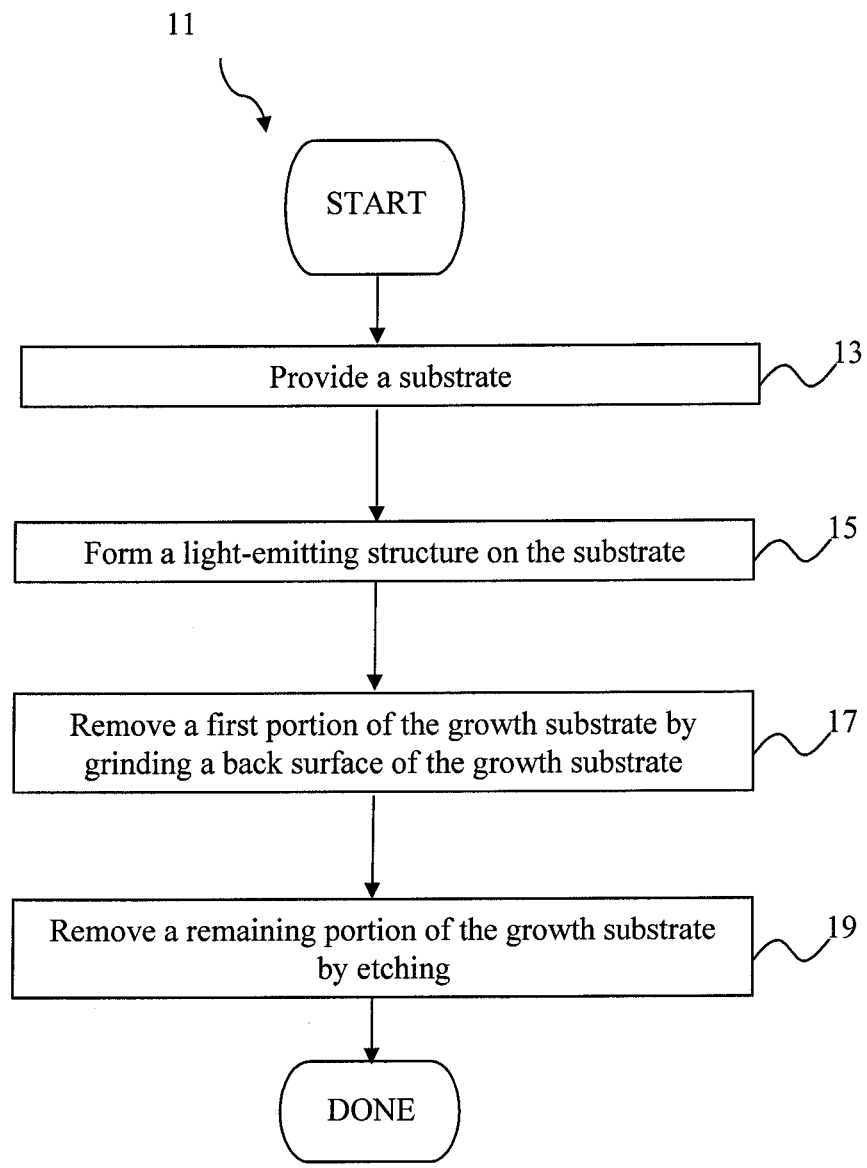
FIGS. 1 and 2 are flowcharts illustrating a method of fabricating a Light-Emitting Diode (LED) according to various aspects of the present disclosure.

It is understood that the following disclosure provides many different embodiments, or examples, for implementing different features of various embodiments. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
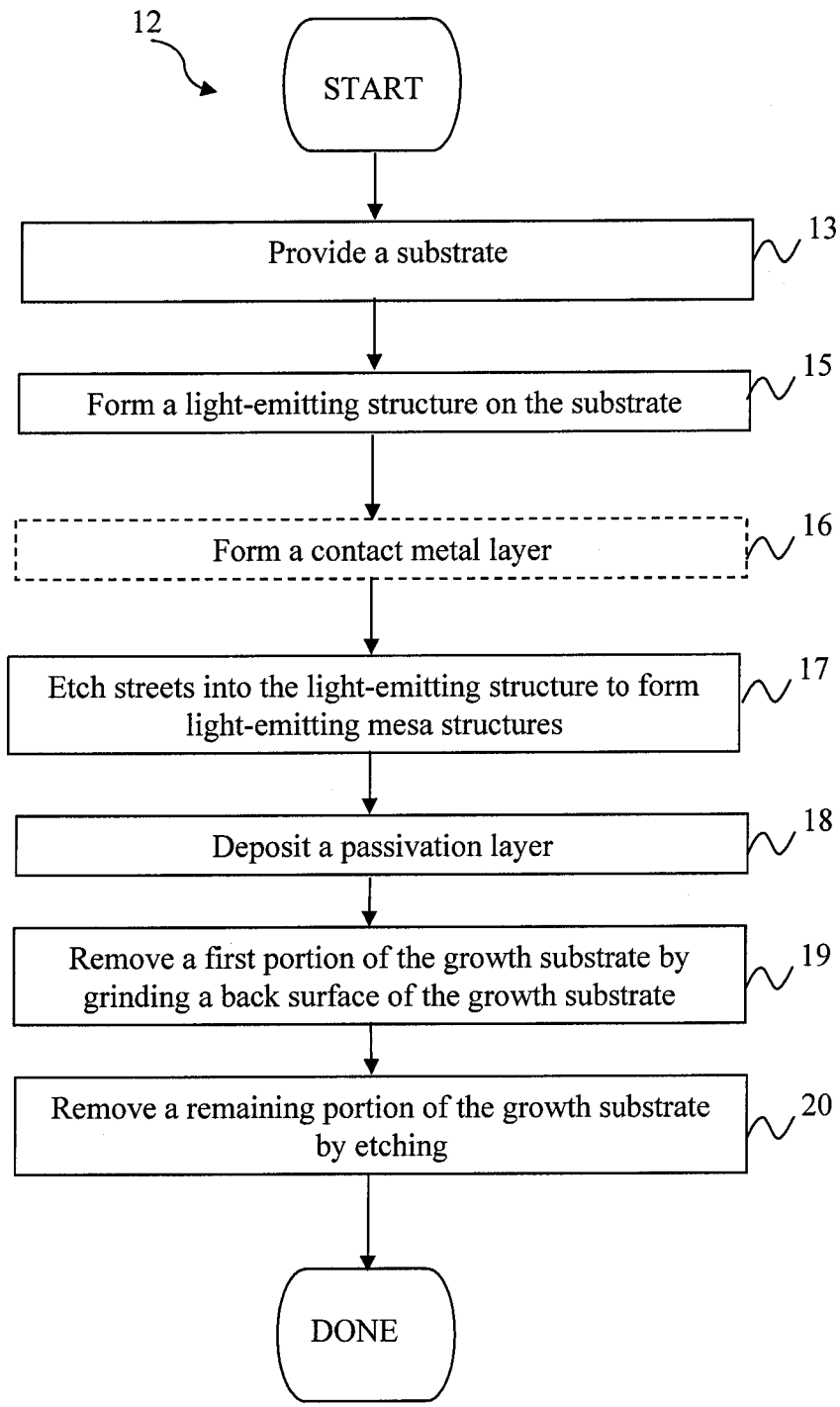

Illustrated in FIGS. 1 and 2 are flowcharts of methods 11 and 12 for fabricating a Light-Emitting Diode (LED) in accordance with the present disclosure. FIGS. 3-15 are diagrammatic fragmentary views of an LED during various fabrication stages in accordance with some embodiments of the present disclosure. An LED may be a part of a display or lighting device having a number of the LEDs, the LEDs either controlled singly or in combination. The LED may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that various figures have been simplified for a better understanding of the inventive concepts of the present disclosure. Accordingly, it should be noted that additional processes may be provided before, during, and after the methods of FIGS. 1 and 2, that some other processes may only be briefly described, and various processes may be substituted for the described processes to achieve the same effect.

Referring to FIG. 1, the method 11 begins with block 13 in which a substrate is provided. The substrate includes a material that is suitable for growing a light-emitting structure. Thus, the substrate may also be referred to as a growth substrate or a growth wafer. In various embodiments, the substrate includes sapphire. In other embodiments, the substrate may include gallium nitride, silicon carbide, silicon, or another suitable material for growing the light-emitting structure. A light-emitting structure is formed on the substrate in operation 15. The light-emitting structure is usually a semiconductor diode.

Figure 3:
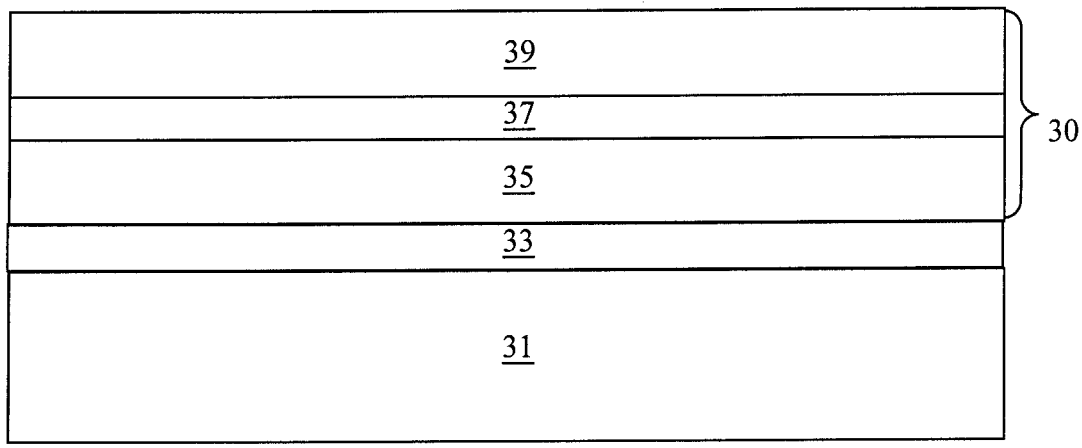
FIGS. 3-15 illustrate various views of the LED at various stages of fabrication according to certain embodiments of the present disclosure.

FIG. 3 shows a light-emitting structure 30 on a substrate 31. A light-emitting structure 30 is formed over the substrate 31. In the present embodiment, the light-emitting structure 30 includes a doped layer 35, a multiple quantum well layer (MQW) 37, and a doped layer 39. The doped layers 35 and 39 are oppositely doped semiconductor layers. In some embodiments, the doped layer 35 includes an n-type gallium nitride material, and the doped layer 39 includes a p-type gallium nitride material. In other embodiments, the doped layer 35 may include a p-type gallium nitride material, and the doped layer 39 may include an n-type gallium nitride material. The MQW layer 37 shown in FIG. 3 includes alternating (or periodic) layers of active material, for example, gallium nitride and indium gallium nitride. As used herein, the active material in an LED is the primary source of light emission from an LED during operation. For example, in one embodiment, the MQW layer 37 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The number of layers of alternating layers and their thicknesses affect the light emission efficiency. The thickness of the MQW layer 37 may be, for example, about 100-2000 nm, about 1 μm, or about 1.5 μm.

In FIG. 3, the doped layer 35, the MQW layer 37, and the doped layer 39 are all formed by epitaxial growth processes. In the epitaxial growth processes, a first undoped layer 33, usually gallium nitride (in some cases aluminum nitride) is grown on the substrate 31. The first undoped layer 33 is also referred to as a buffer layer 33. The buffer layer may be about 500 nm to 5 µm, for example, about 1.5 µm or about 2 µm. The layers 35, 37, and 39 are grown subsequently. The doping may be accomplished by adding impurities into a source gas during the epitaxial growth processes. During the epitaxial growth processes, a p-n junction (or a p-n diode) including the MQW layer 37 between the oppositely doped layers 35 and 39 is formed. When an electrical voltage is applied between the doped layer 35 and the doped layer 39, an electrical current flows through the light-emitting structure 30 and the MQW layer 37 emits radiation. The color of the light emitted by the MQW layer 37 is associated with the wavelength of the emitted radiation, which may be tuned by varying the composition and structure of the materials that make up the MQW layer 37. For example, a small increase in the concentration of indium in the indium gallium nitride layer is associated with a shift of the wavelength output toward longer wavelengths.

The operation of forming a light-emitting structure 30 may optionally include the formation of additional layers not shown in FIG. 3. For example, an ohmic contact layer or other layers may be added on the doped layer 39. These other layers may include an indium tin oxide (ITO) layer, or another transparent conductive layer.

To promote good electrical contact, light extraction, and efficient cooling of the LED during operation, the growth substrate is removed in many LED products, especially for high power LEDs. In one example, an interface between the growth substrate and the buffer layer 33 is destroyed with electromagnetic radiation (for example, an excimer laser), which decomposes the buffer material at the interface. This interface may be an undoped gallium nitride layer. The growth substrate, for example, sapphire, may be lifted off and removed. In this laser lift-off (LLO) method, a laser beam generated by an excimer laser is injected from the sapphire side into the light-emitting structure to decompose the gallium nitride material at the interface between the substrate and the buffer layer to gallium atoms and nitrogen gas. The LLO method is conventionally adopted for manufacturing LEDs when the substrate is removed. One particular feature of the LLO method is that in many cases the sapphire removed may be recycled and used again as a growth substrate, saving material costs. However, the LLO method is not suitable for many advanced LED applications and streamlined manufacturing as discovered by the inventors and disclosed herein.

The LLO process generally uses high laser power density to decompose the gallium nitride at the buffer layer/substrate interface. The laser spot is usually set to the LED die size to ensure a clean lift-off. As the growth substrates increase in size, more and more LED dies are grown on the same substrate, which increases the LLO process time as the laser moves from spot to spot (die to die). Because the high power density limits the laser beam area or spot, the size of LED die suitable for the LLO process is also limited. As high-power LED applications using larger LED die are more widely used, the LLO process cannot keep up with the requirement to cleanly lift-off larger and larger dies.

To ensure the entire substrate may be removed, the laser spot overlaps slightly at the edge. However, the high power density is very destructive and crack formation at the edge of each overlapped laser spot can result. The laser would damage exposed surface and sidewalls of the light-emitting structure. These cracks and damages can cause current leakage during operation.

Because the laser beam enters through the sapphire, the LLO process result may be non-uniform if the sapphire surface includes irregularities after the light-emitting structure is grown. Hence, conventional LLO method also includes a backside sapphire polishing step to promote LLO process uniformity. The sapphire polishing reduces the likelihood that the sapphire may be recycled at the end of the process and adds manufacturing time and cost.

In one aspect, the present disclosure pertains to a method of removing a growth substrate in multiple operations that does not include the use of a laser beam. The sapphire substrate is ground first to a first specified thickness using a single abrasive or multiple abrasives. The remaining sapphire substrate is removed by dry etching or wet etching.

Referring back to FIG. 1, in operation 17 a first portion of the growth substrate is removed by grinding a back surface of the growth substrate. In some embodiments, the grinding is tuned to remove sufficient growth substrate such that about 3 µm to about 20 µm about 10 µm, or about 5 µm remains. The grinding may be accomplished in one operation or several operations depending on the abrasive used. The grinding tool is a wheel containing diamond particles of very fine dimension bonded with epoxy or wax. When the substrate is placed on the tool, the grinding wheel presses on the substrate backside and rotates in different directions. By the shear force exerted on the substrate, the hard diamond particles remove silicon from the substrate backside. Grinding operations to thin silicon substrates may additionally involve chemical etchants. Some commercially available tools for backside grinding of silicon substrates may be configured for other substrates such as sapphire substrates.

In one example, only one grinding operation is used. The abrasive may be diamond particles with a size of 15 to 5 µm. The selection of the abrasive maximizes removal rate while maintaining control over grinding uniformity and rate. The grinding operation may be about 30 minutes to 90 minutes.

In other examples, more than one grinding operation is used. The first grinding operation may remove less material than the single grinding operation in the other example. The first grinding operation may remove sufficient growth substrate such that more than 6 µm remains. For example, using diamond particle abrasives, the wafer may be ground using large size particle abrasives to thin the wafers from about 430 to about 50 µm with grinding time of about 35 minutes. The about 50 µm thick wafer is then ground again in a second stage grinding process to about 5 µm thickness using 6 µm diamond particle abrasives for about 20 minutes. The first operation abrasive may be selected to maximize removal rate. In a second stage grinding process, the grinding completes the growth substrate removal down to the specified thickness. Thus the first abrasive may be harder and/or coarser than the second abrasive and other subsequent abrasives when more than two operations are used. In contrast from the LLO process, the initial sapphire backside surface condition is not relevant for the grinding process. Thus no surface preparation is performed before the grinding operation, unlike the LLO process, which requires the surface to be polished.

After the grinding operation 17, a remaining portion of the growth substrate is removed by etching in operation 19 of FIG. 1. In some embodiments, the etching is dry etching using inductively coupled plasma (ICP). The ICP etch may involve inert species such nitrogen, argon, krypton, xenon, oxygen, and other known gases. The ICP etch may also involve reactive ion species such as fluorine containing etchants (i.e., $CF_4$, $CHF_3$, $SF_6$, $C_4F_8$, $C_4F_{10}$, $C_xF_{2x+2}$, $CCl_3F$, $CCl_2F_2$, $CF_3Cl$, $C_2ClF_5$), chlorine containing etchants (i.e., $BCl_3$, $BCl_3+Cl_2$, $CCl_4$, $CCl_4+Cl_2$, $BCl_3+Cl_2$, $CCl_3F$, $CCl_2F_2$, $CF_3Cl$, $C_2ClF_5$), bromine containing etchants (i.e., HBr), and other halogen containing etchants. A high-density plasma is produced in situ in the process chamber. The plasma etching operation may be conducted at a substrate temperature of less than about 150° C., preferably at about room temperature. A bias may be applied to the substrate to direct the plasma toward the surface.

The plasma dry etching may be performed with other plasma generation methods, including capacitively coupled plasma (CCP), magnetron plasma, electron cyclotron resonance (ECR), or microwave. The plasma may be generated in situ or remotely. The plasma may have high ion density.

Alternatively, in some embodiments the etching is wet etching. The wet etching may involve sulfuric acid, phosphoric acid, or a combination of these etchants. In a wet etch, the substrate is immersed in an etchant solution for a time until sufficient amount of the growth substrate is removed. The sulfuric acid may be $H_2SO_4$, and the phosphoric acid may be $H_3PO_4$. The etchant solution may also include amounts of $CH_3COOH$, $HNO_3$, water, and other commonly used etchant components. For example, the etchant solution may be a $3H_2SO_4$: $1H_3PO_4$ mixture with $CH_3COOH$, $HNO_3$, and water. The etchant solution is heated to greater than 100° C., over 200° C., over 300° C., or over 400° C. The wet etching may occur in a chamber under pressure, for example, at above 1 atmosphere, or above 1.5 atmospheres, or above 2 atmospheres. One typical wet etching solution is $3H_2SO_4$:$1H_3PO_4$ mixture with $CH_3COOH$, $HNO_3$, and water with temperature of 300° C. under atmospheric pressure. One skilled in the art would be able to design a wet etching process to achieve a suitable etch rate and selectivity. Because the entire partially fabricated LED is exposed to the etchant solution, portions of the device may be protected first with a passivation layer. The passivation layer is selected to have a much lower etch rate than the growth substrate for the etching process. The passivation layer must also adequately cover the exposed light-emitting mesa structure sidewall, in other words, be sufficiently conformal so no unwanted etching occurs on the device itself.

FIG. 2 is a process flow diagram of an example flow 12 in accordance with the broader flow 11 and various embodiments of the present disclosure. Example flow 12 illustrates one process for making an LED package with an LED with its substrate removed in accordance with the method embodiments of the present disclosure. Other types of LED packages made with processes other than example flow 12 may also be suitable for the LED with its substrate removed in accordance with the method embodiments of the present disclosure. An example includes a flipped LED package attached to a package substrate by solder bumps.

Referring to FIG. 2, in operation 13, a growth substrate such as a sapphire substrate is provided. In operation 15, a light-emitting structure is formed on the substrate. Then a contact metal layer is optionally formed on the light-emitting structure and a bonding metal layer is formed over the contact metal layer, in operation 16. A reflecting metal layer may be disposed between the contact metal layer and the bonding metal layer. The structure is then etched using a scribe pattern to form light-emitting mesa structures in operation 17. A passivation layer is deposited in operation 18 to protect the mesa structure, especially exposed mesa sidewall portions. In operation 19, a first portion of the growth substrate is removed by grinding a back surface of the substrate. As discussed above, the grinding operation may include one or more operations using different abrasives. Then in operation 20, a remaining portion of the growth substrate is removed by etching, either plasma etching, wet etching, or a combination of both.

Figure 4:
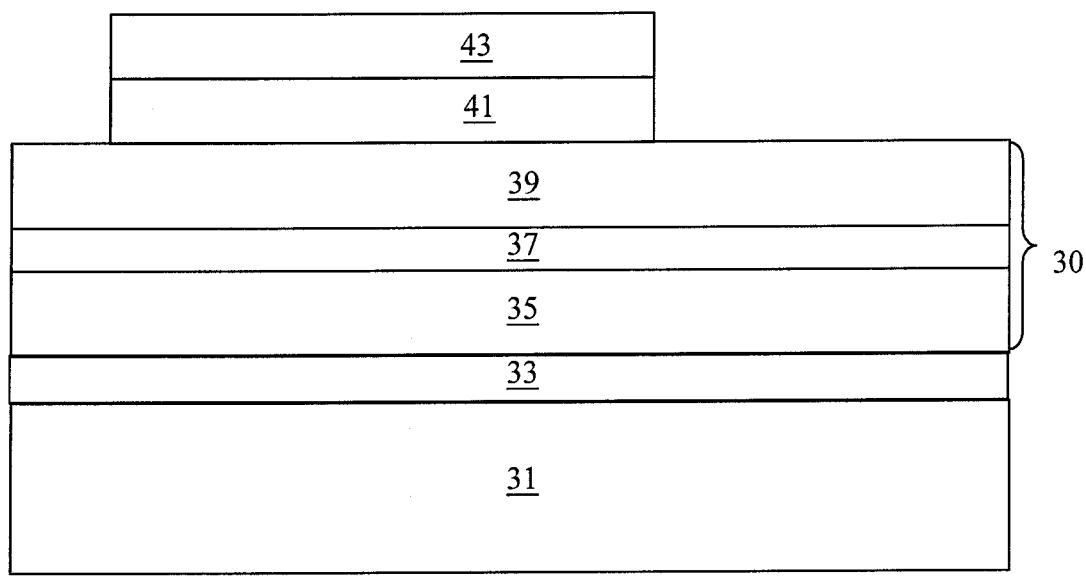

FIGS. 3 to 15 illustrate example intermediate structures of the process flow of FIG. 2. FIG. 3 depict forming the light-emitting structure 30 as disclosed above. FIG. 4 shows a contact metal layer 41 and optionally a reflecting metal layer 43 formed on the light-emitting structure 30. The contact metal layer 41 is a metal, which may be nickel, an alloy of nickel such as nickel/gold, or some metallic alloy such as chromium/platinum/gold, titanium/aluminum/titanium/gold, or other similar alloys. In one embodiment, the contact metal layer 41 is a nickel/silver alloy. The contact metal layer 41 adheres well to the top layer of the light-emitting structure 30 and the reflecting metal layer 43. A light reflecting layer 43 may be a metal, such as aluminum, copper, titanium, silver, gold, alloys of these such as titanium/platinum/gold, or combinations thereof. Particularly, silver and aluminum are known to be good reflectors of blue light. The light-reflecting layer may be formed by a physical vapor deposition (PVD) process or a chemical vapor deposition (CVD) or other deposition processes. Together, the contact metal layer 41 and a reflecting metal layer 43 may have a thickness of about 300 nm.

The contact metal layer 41 and the optional reflecting metal layer 43 are deposited using the same pattern using a PVD process or a CVD process or other deposition processes. The layers may be deposited using different techniques. For example, layer 43 may be deposited using electrochemical plating while layer 41 may be deposited using PVD.

Figure 5:
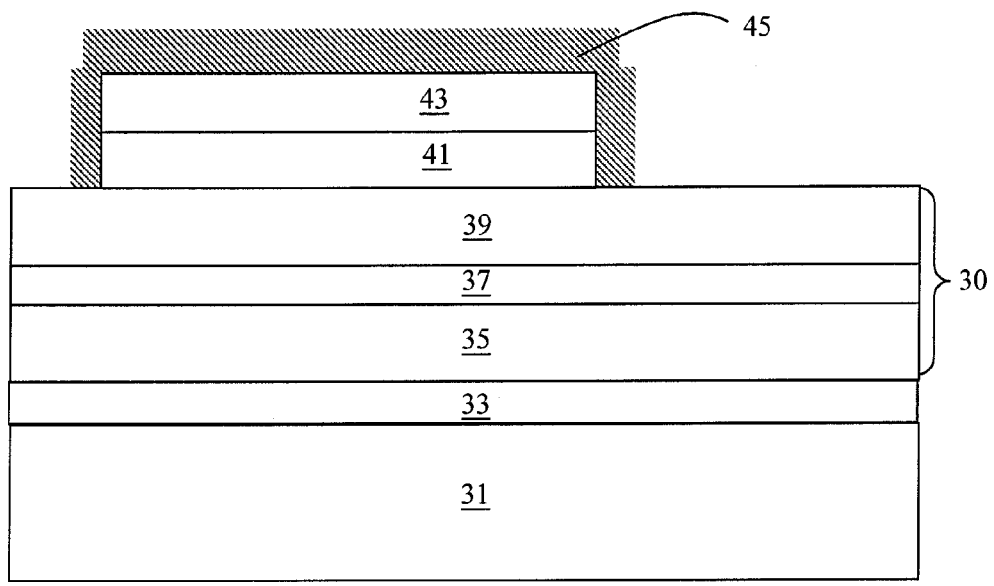
Figure 6:
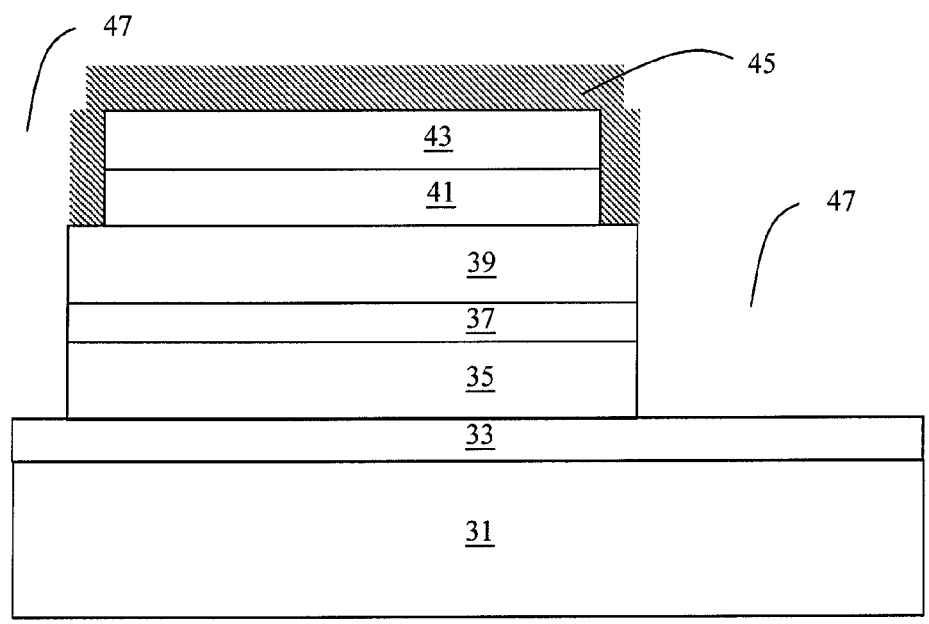

FIG. 5 shows a photoresist pattern 45 on and around the metal layers 41 and 43. A photoresist pattern 45 is deposited, exposed, and developed on the workpiece. The pattern defines an area around the metal layers 41 and 43. FIG. 6 shows the streets 47, or grooves, etched to the light-emitting structure 30 of FIG. 5 according to the photoresist pattern 45. The streets 47 separate individual light-emitting mesa structures. While the streets are shown to have high aspect ratios, the drawings are not to scale and in reality the streets may be much wider than they appear. The mesa structure may be a total of several microns high and hundreds or thousands of microns wide. The street width may be more than 50 microns wide. As shown, the etch stops at about the interface between the buffer layer 33 and the growth substrate 31. In various embodiments, the process may include a slight overetch and the substrate 31 may act as an etch stop layer.

The light-emitting mesa structure etch may be a dry etch or a wet etch. For dry etching, an inductively coupled plasma may be used with argon or nitrogen plasma. For wet etching, HCl, HF, HI, $H_2SO_4$, $H_2PO_4$, $H_3PO_4$, or a combination of these sequentially may be used. Some wet etchants require a higher temperature to reach an effective etch rate, such as phosphoric acid with etching temperature of about 50° C. to about 100° C.

Figure 7A:
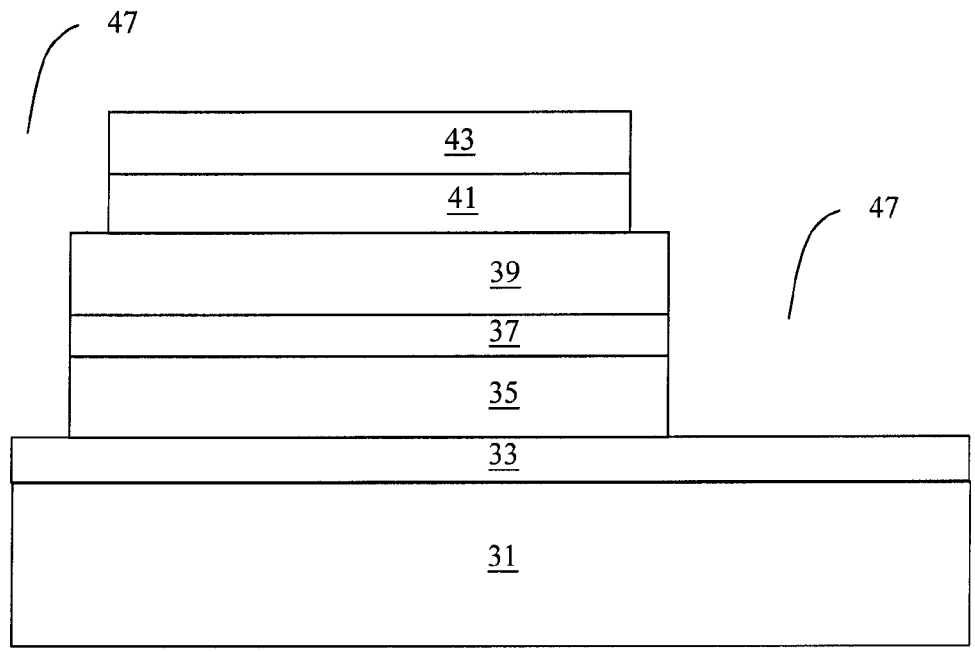
Figure 7B:
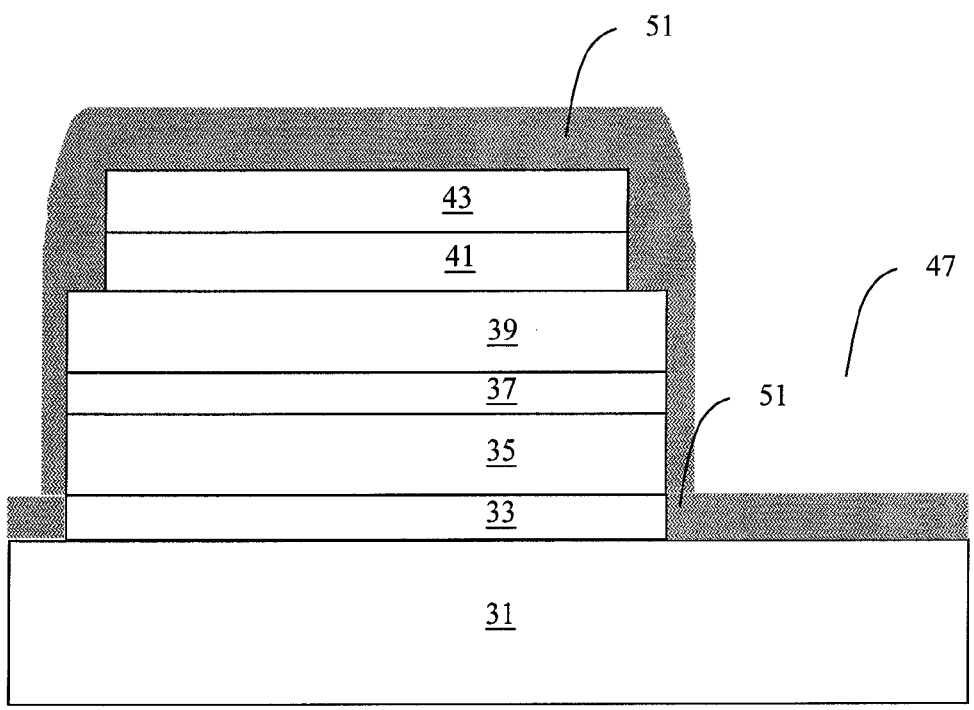

After the light-emitting mesa structure etch, the photoresist pattern 45 is removed, as shown in FIG. 7A. A passivation layer 51 is then formed on the top and sidewalls of the light-emitting mesa structure and on the substrate in the streets 47 as shown in FIG. 7B. The passivation layer 51 passivates the exposed surface against unwanted reactions caused by materials used in subsequent processing. Particularly, the passivation layer 51 protects the exposed sidewalls of the light-emitting mesa structures from subsequent processing operations of photoresist removal, backside (growth substrate) grinding, and backside etching. Thus, the passivation layer 51 is selected to have a much lower etch rate than the growth substrate for the etching process. The passivation layer 51 must also adequately cover the exposed light-emitting mesa structure sidewall, in other words, be sufficiently conformal. Depending on the passivation layer material, this consideration may limit the types of processes that can be used to deposit the material.

In some embodiments, the passivation layer 51 may be a silicon oxide, silicon nitride, silicon oxynitride, silicon carbide, carbon-doped silicon oxide, carbon-doped silicon nitride, or other known non-conductive passivation material. For example, a silicon oxide may be deposited using plasma-enhanced chemical vapor deposition (PECVD) process. PECVD is conventionally used, because other dielectric deposition techniques use a higher temperature, which may cause problems with the metals layers 41 and 43 previously deposited. Using PECVD to deposit a silicon oxide, one skilled in the art would be able to tune the process to deposit a suitable film.

To avoid a leakage current around the MQW layer 37, it is particularly important to passivate the sidewall at the MQW layer 37 and portion of adjacent layers. Passivating a greater area is beneficial because it decreases the likelihood that subsequent etching processes harm the light-emitting structure 30. Depending on the process and material used, the passivation layer 51 may deposit and form different thicknesses at the sidewall and on the field, or horizontal, regions as shown. The passivation layer 51 as measured from the sidewall into the light-emitting mesa structures may be about 600 angstroms, or at least 100 angstroms, and may be as much as 1000 nm, depending on the type of plasma and bias used.

Figure 8A:
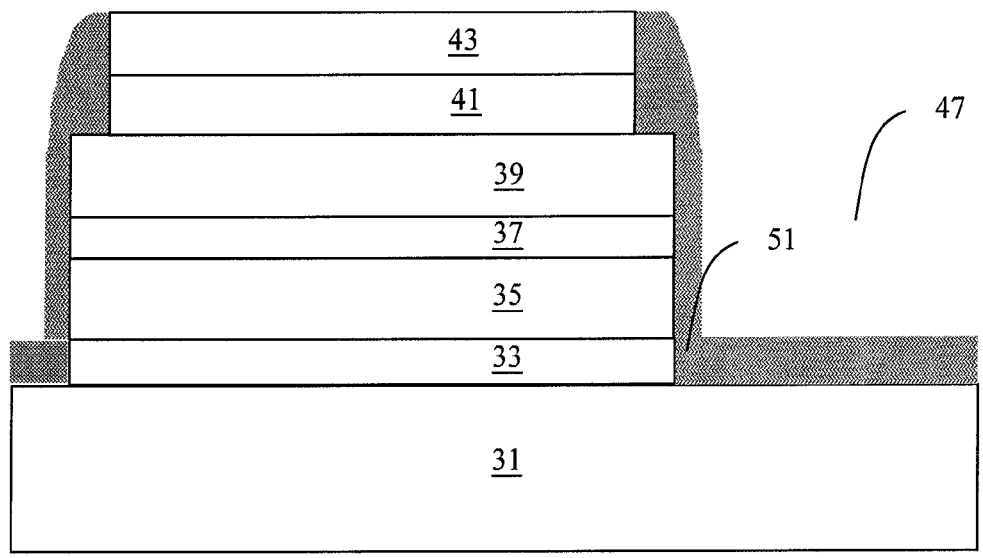

A portion of the passivation layer 51 on top of the light-emitting mesa structure is then removed by patterning and etching, as shown in FIG. 8A. As shown, the passivation layer 51 above layer 39 is removed to expose contact metal layer 41 and reflecting metal layer 43. A photoresist pattern is formed over the passivation layer 51 that protects a portion of the passivation layer 51 in the street and on the sidewalls of the light-emitting mesa structures. The unprotected portion of the passivation layer 51 over the light-emitting mesa structures over and around the metal layers 41 and 43 is then etched away by dry etching or wet etching.

Figure 8B:
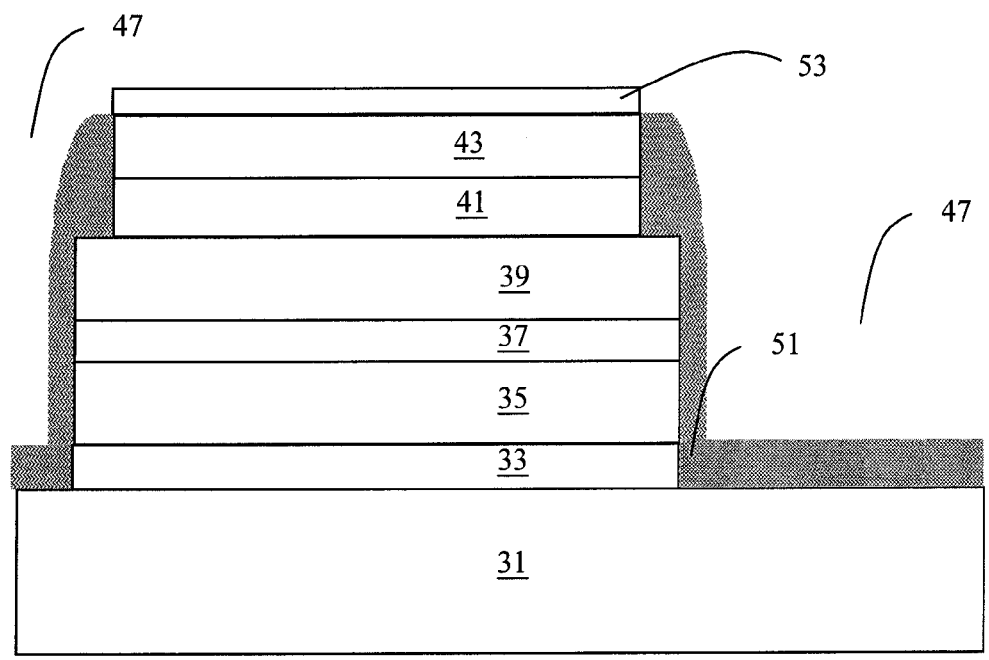

FIG. 8B shows the addition of bonding metal layer 53 to the contact metal layer 41 and reflecting metal layer 43. The bonding metal material may be a soft metal suitable for bonding with an adhesion metal layer on a bonding substrate. For example, the bonding metal may be gold or a gold/tin alloy. After removing a portion of the passivation layer 51, the photoresist patterns need not be removed or stripped for the bonding metal material deposition. The bonding metal may be deposited using PVD, CVD or other deposition process including electrodeposition or electroless deposition.

Figure 9:
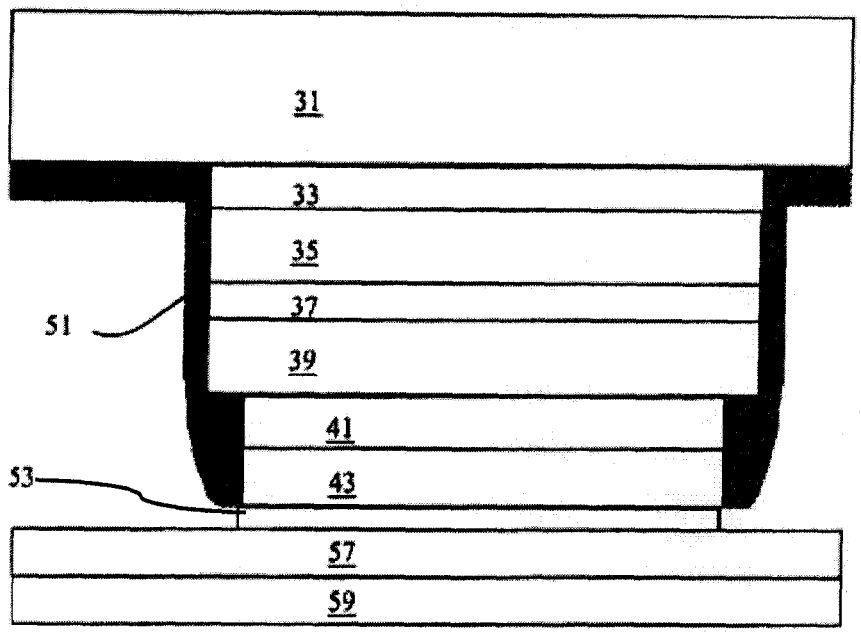

The light-emitting mesa structures and the growth substrate are flipped over and bonded to a bonding substrate as shown in FIG. 9. The bonding metal layer 53 is bonded to an adhesion metal layer 57 on a substrate 59. Substrate 59 is usually a silicon substrate, but may also be metal or ceramic. A suitable substrate would have a high thermal conductivity, such as silicon or copper. The adhesion metal layer may be made of gold, tin, or an alloy of these. The bonding metal layer 53 and the adhesion metal layer 57 may be bonded via eutectic bonding or metal bonding. For eutectic bonding, the bonding metal layer may be a gold/tin alloy and the adhesion metal layer may be made of gold. For metal bonding, both metal layers 53 and 57 may be gold.

Figure 10:
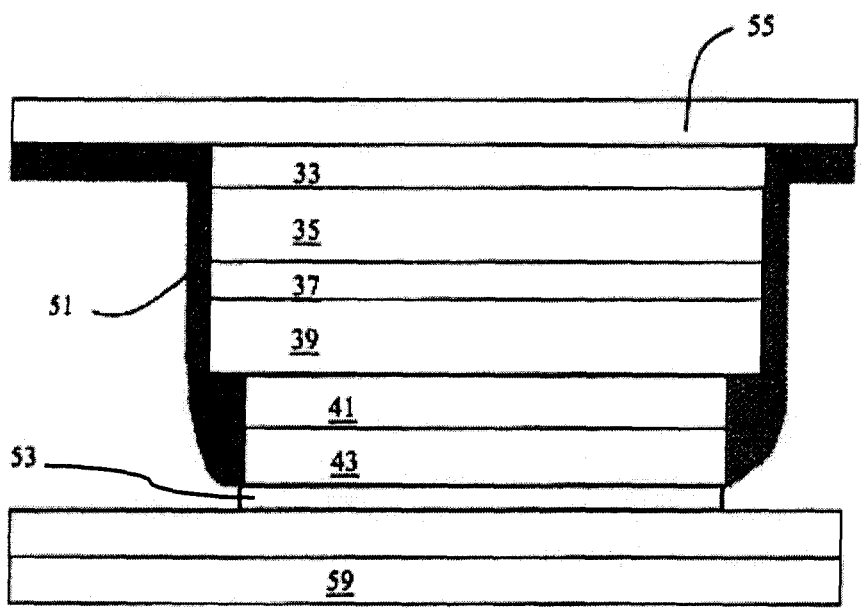
Figure 11:
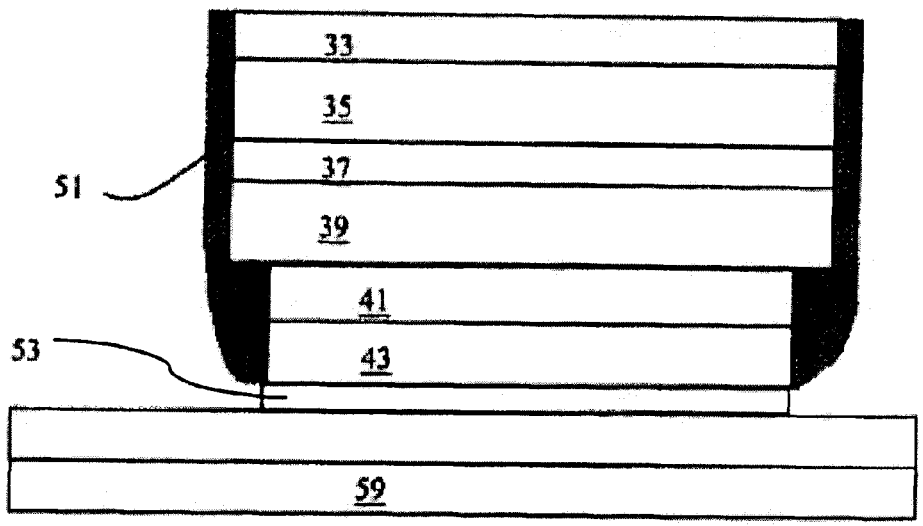

After the LED dies are bonded to the substrate, the growth substrate 31 is removed in several operations as described herein. FIG. 10 shows a thinned growth substrate 55 after one or more grinding operations. FIG. 11 shows the light-emitting mesa structures bonded to the bonding substrate 59 after the growth substrate is completely removed. As disclosed, the thinned growth substrate 55 is removed by dry etching or wet etching. After the growth substrate is completely removed, the individual light-emitting mesa structure is referred to as an LED die. Each LED die is capable of generating light independently from one another.

Figure 12:
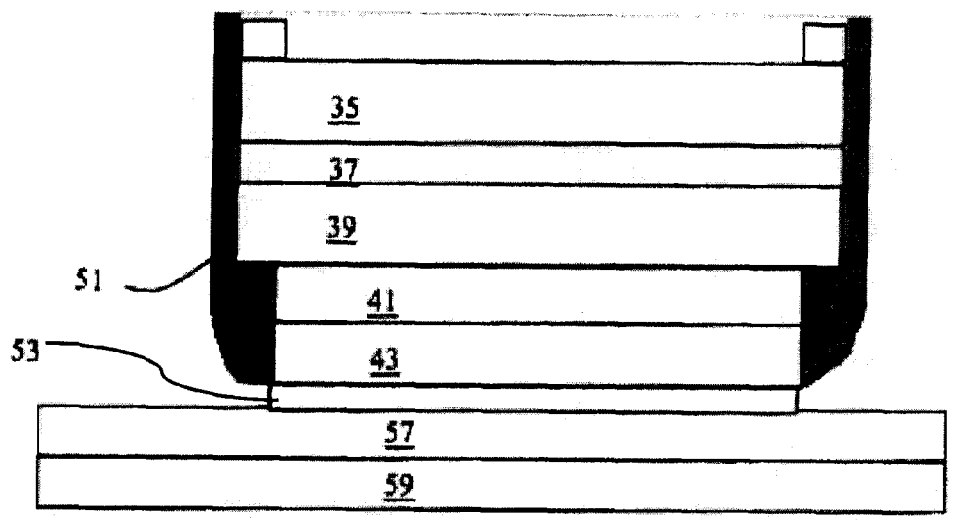

FIG. 12 shows the substrate mounted LED dies having a portion of the buffer layer 33 removed. A photoresist pattern may be first applied to protect portions of the structure from the removal process. The photoresist pattern may be applied to the edges of the LED die, the passivation layer surface 51, and surfaces of the metal layers 53 and 57. A dry etch process may be employed, for example, inductively coupled plasma process to remove portion of the buffer layer 33. Note that although FIG. 12 shows the edge of buffer layer 33 remaining on the LED die, it is not necessary. The figures and text describes protecting the edges using a photoresist so as to not to remove the passivation layer 51. However, other methods to protect the passivation layer 51 may be used, such as depositing first a sacrificial layer before removing the buffer layer. Generally, ICP with a bias to perform physical etching using heavier molecules, such as argon, krypton, or xenon, may be used.

Figure 13:
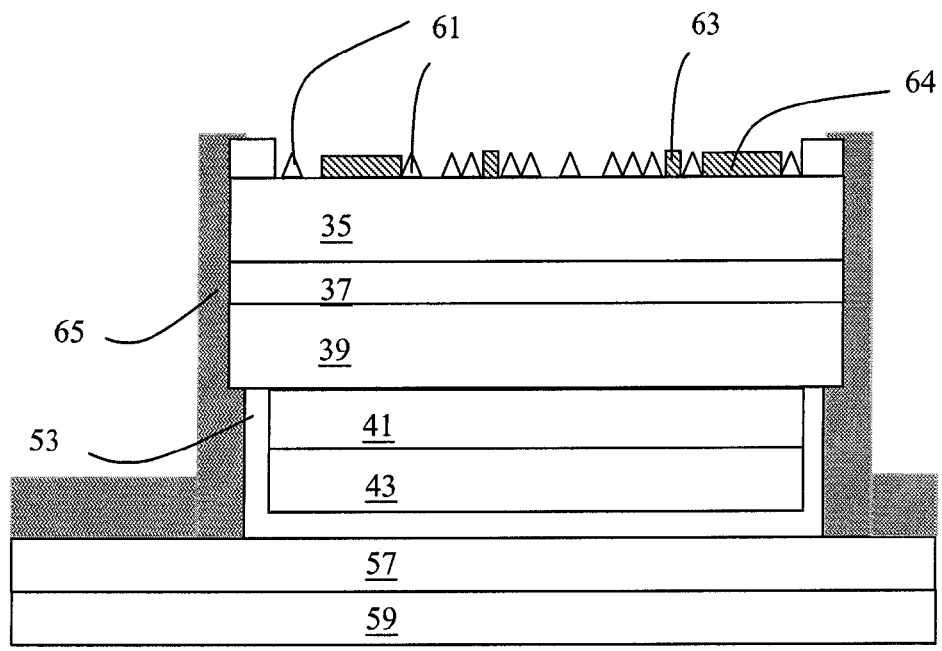
Figure 14:
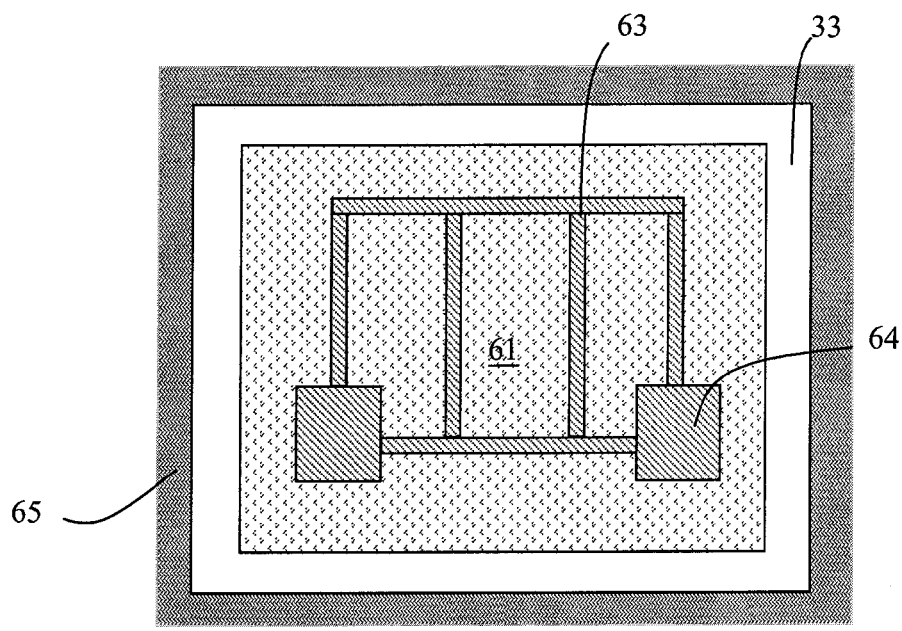

Referring to FIG. 13, the exposed surface of the first doped layer 35 is then treated to obtain a rough surface 61 and form metal contacts 63 and 64 at the surface. In some embodiments, the surface is patterned first to protect areas on which the metal contacts 63 would form and then treated with plasma to form a rough surface. A plasma etch using chemical etchants such as chlorine is used to etch the surface along the gallium nitride crystal lattice structure, forming a rough surface having small triangular shapes. The roughened surface may then be patterned for the contact metal deposition. In certain embodiments, the contact metal is deposited to form an interconnect pattern on the die surface with thin contacts 63 with a number of contact pads 64. Such an interconnect structure spreads the current throughout the surface. An example contact pattern is shown in FIG. 14. The contact pads 64 are connected by thin contact structures 63. The thin contacts 63 may be about 20 to about 30 μm wide, while the contact pads may be about 50 to 80 μm wide. Note that while a photoresist patterning step may be skipped by forming the contacts on a roughened surface or by subjecting the contact metal to plasma etching, the contact resistance may correspondingly increase.

An additional passivation layer material 65 may be also deposited to protect the exposed bonding metal layer 53 sidewalls. The additional passivation layer material 65 may be of the same composition as passivation layer 51 or different materials. The passivation layer material 65 may be deposited directly over the passivation layer 51.

An LED is essentially formed after the contact structure 63 and 64 are completed. Optionally, the LED may be tested and binned while mounted on the bonding substrate before dicing. During testing and binning, electrodes are moved across the substrate from LED die to LED die. The light output at each LED die is measured. At this stage, any defect in the LED die causing light output that is below a minimum specification can be marked and removed from subsequent processing. When a defective LED die is discovered much later, the discard may include more material and manufacturing costs such as packaging, lens molding, and phosphor coating. Such early defective product removal saves manufacturing time and material costs. LED die with light outputs that meet the minimum specification are categorized into different bins for further manufacturing of products having different specifications.

Figure 15:
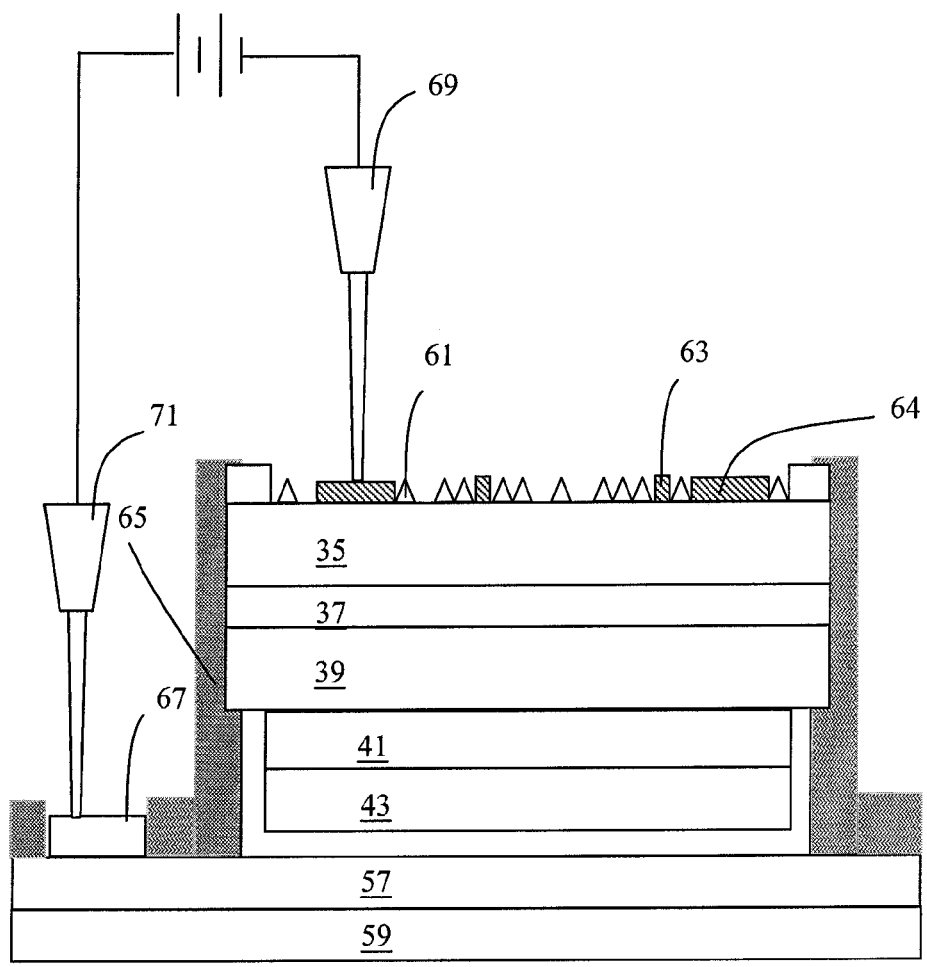

FIG. 15 shows an example of testing and binning substrate mounted LED dies. Temporary contacts are formed in the streets between the LED dies for testing and binning the individual dies as shown. A portion of the passivation layer material 65 is patterned and opened to allow the temporary contact 67 to be deposited. This operation may occur concurrently with deposition of the contact structure of 63 and 64. During the testing and binning process, a current is conducted across the LED die and the resulting light output measured. A pair of electrode probes 69 and 71 contact the contact 64 and the temporary contact 67. The testing may include measuring different output in response of different current inputs. LED dies that respond similarly are binned together. One skilled in the art may note that one temporary contact may be used for testing several adjacent LED dies when the structures are tested one at a time and have the same geometry.

After the LED dies are binned, they can be diced or separated into individual LEDs. The dicing process may be a non-etching process where a cutting device, such as a laser beam or a saw blade, is used to physically separate the LED dies. After being diced, each LED die is capable of generating light and is physically and electrically independent from one another.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a light-emitting diode (LED) comprising:
    providing a sapphire substrate;
    forming an undoped buffer layer over the sapphire substrate;
    forming a light-emitting structure over the undoped buffer layer, said structure comprising:
        a first doped layer doped with a first impurity of a first conductivity type;
        an active layer over the first doped layer; and
        a second doped layer over the active layer, the second doped layer doped with a second impurity of a second conductivity type opposite the first conductivity type;
    removing a first portion of the sapphire substrate by grinding a back surface of the sapphire substrate;
    thereafter removing the sapphire substrate in its entirety by etching; and
    thereafter removing a portion of the undoped buffer layer so as to form a recess in the undoped buffer layer.

2. The method of claim 1, wherein after the removing the first portion, the sapphire substrate in its entirety has a thickness in a range from about 3 µm to 6 µm.

3. The method of claim 1, wherein the grinding the back surface of the sapphire substrate comprises sequentially using two abrasives having different hardness or particle sizes.

4. The method of claim 1, wherein the etching includes an etching process using a plasma.

5. The method of claim 4, wherein the plasma is inductively coupled plasma.

6. The method of claim 5, wherein the plasma includes halogen containing etchants.

7. The method of claim 1, wherein the etching is wet etching.

8. The method of claim 7, wherein the wet etching comprises exposing the substrate to a solution of sulfuric acid, phosphoric acid, or a solution including both sulfuric acid and phosphoric acid.

9. The method of claim 8, wherein a temperature of the solution is greater than 110° C., and wherein a pressure of the solution is greater than one atmosphere pressure.

10. The method of claim 1,
    wherein the undoped buffer layer and the sapphire substrate have different material compositions.

11. A method of fabricating a LED, comprising:
    providing a growth substrate;
    forming a light-emitting structure on the growth substrate, said structure comprising:
        a buffer layer;
        a first doped layer on the buffer layer, said first doped layer doped with a first impurity of a first conductivity type;
        an active layer over the first doped layer; and
        a second doped layer over the active layer, the second doped layer doped with a second impurity of a second conductivity type opposite the first conductivity type;
    forming a patterned contact metal layer on the second doped layer;
    forming, after the forming the patterned contact metal layer, a patterned reflecting metal layer on the patterned contact metal layer;
    forming, after the forming the patterned reflecting metal layer, a photoresist layer on the patterned reflecting metal layer;
    forming, after the forming the photoresist layer and using the photoresist layer as a mesa pattern, a plurality of streets into the light-emitting structure, thereby forming a plurality of light-emitting mesa structures with exposed sidewalls;
    depositing, after the forming the plurality of light-emitting mesa structures, a passivation layer to cover the exposed sidewalls;
    removing, after the depositing the passivation layer, a portion of the passivation layer to expose a surface of the reflecting metal layer;
    forming, after the surface of the reflecting metal layer has been exposed, a bonding metal layer on the exposed surface of the reflecting metal layer;
    bonding, after the forming the bonding metal layer, the growth substrate to a silicon substrate having an adhesion metal layer formed thereon, wherein the bonding metal layer of the growth substrate is bonded to the adhesion metal layer of the silicon substrate;
    after the bonding, removing a first portion of the growth substrate by grinding a back surface of the growth substrate, wherein the growth substrate not removed by the grinding is a second portion of the growth substrate; and
    completely removing the second portion of the growth substrate by etching.

12. The method of claim 11, further comprising removing at least a portion of the buffer layer after completely removing the second portion of the growth substrate, wherein the buffer layer contains an undoped material that is different from a material of the growth substrate.

13. The method of claim 12, wherein the removing the at least the portion of the buffer layer exposes a surface of the first doped layer, and further comprising:
    roughing a first portion of the exposed surface of the first doped layer; and
    forming a metal contact on a second portion of the exposed surface of the first doped layer.

14. The method of claim 13, further comprising:

forming a temporary contact on the adhesion metal layer;

applying a voltage across the temporary contact and the metal contact on the first doped layer so that a light is emitted from at least one of the light-emitting mesa structures;

measuring the light emitted by the at least one of the light-emitting mesa structures; and binning the at least one of the light-emitting mesa structures based on the measuring of the emitted light.

15. The method of claim 11, wherein the etching comprises using capacitively coupled plasma (CCP), inductively coupled plasma (ICP), magnetron plasma, electron cyclotron resonance (ECR) plasma, or microwave plasma.

16. The method of claim 11, wherein the etching comprises exposing the substrate to a solution of $H_2SO_4$, $H_3PO_4$, or a solution including both $H_2SO_4$ and $H_3PO_4$.

17. A method of fabricating a LED, comprising:

providing a growth substrate;

forming a light-emitting structure on the growth substrate, said structure comprising:

a buffer layer;

a first doped layer on the buffer layer, said first doped layer doped with a first impurity of a first conductivity type;

an active layer over the first doped layer; and a second doped layer over the active layer, the second doped layer doped with a second impurity of a second conductivity type opposite the first conductivity type;

etching a plurality of streets into the light-emitting structure forming a plurality of light-emitting mesa structures;

removing a first portion of the growth substrate by grinding a back surface of the growth substrate so that a remaining portion of the growth substrate is a rest of the growth substrate not removed by the grinding;

completely removing the remaining portion of the growth substrate in its entirety by plasma etch or wet etch; and thereafter forming a recess in the buffer layer by removing a portion of the buffer layer.

18. The method of claim 1, further comprising: before the removing the first portion of the sapphire substrate, bonding the sapphire substrate to a silicon substrate, wherein the light-emitting structure is bonded between the sapphire substrate and the silicon substrate.

19. The method of claim 18, further comprising: before the bonding:

forming a contact layer on the second doped layer;

forming a reflecting metal layer on the contact layer; and forming a bonding metal on the reflecting metal layer;

wherein the bonding is performed such that the bonding metal is bonded between the reflecting metal layer and the silicon substrate.

20. The method of claim 17, wherein the buffer layer is undoped and has a different material composition than the growth substrate, and further comprising:

before the removing the first portion of the growth substrate, bonding the growth substrate to a silicon substrate.

* * * * *